United States Patent [19]
Tihanyi et al.

[11] Patent Number: 4,688,071
[45] Date of Patent: Aug. 18, 1987

[54] CIRCUIT ARRANGEMENT COMPRISING A PHOTOTRANSISTOR

[75] Inventors: Jenoe Tihanyi; Christine Fellinger; Ludwig Leipold, all of Munich, Fed. Rep. of Germany

[73] Assignee: Siemens Aktiengesellschaft, Berlin and Munich, Fed. Rep. of Germany

[21] Appl. No.: 663,363

[22] Filed: Oct. 22, 1984

[30] Foreign Application Priority Data

Dec. 8, 1983 [DE] Fed. Rep. of Germany ....... 3344428

[51] Int. Cl.$^4$ ............................................ H01L 27/02
[52] U.S. Cl. ....................................... 357/41; 357/43; 307/304; 307/311; 307/570
[58] Field of Search ..................... 357/41, 43; 307/304, 307/311, 570

[56] References Cited

U.S. PATENT DOCUMENTS

| | | | |
|---|---|---|---|
| 3,264,493 | 8/1966 | Price | 357/41 |
| 3,518,454 | 6/1970 | Feneh | 307/304 |
| 4,390,790 | 6/1983 | Rodriguez | 250/551 |
| 4,396,932 | 8/1983 | Alonas | 307/311 |
| 4,441,117 | 4/1984 | Zommer | 357/41 |

OTHER PUBLICATIONS

IEEE Electron Device Letters, vol. EDL-1, No. 5, May, 1980 "A New Photo-Sensitive Voltage-Controlled Differential Negative Resistance Device—The Lambda Bipolar Photo-Transiscot", by Ching-Yuan Wu et al., pp. 81 and 82.
Siemens Components XVII (1982) No. 3, pp. 83 through 87—"Solid State Relays (SSR)—Performance and Practical Use", by Walter Brunnler.

Primary Examiner—Martin H. Edlow
Attorney, Agent, or Firm—Hill, Van Santen, Steadman & Simpson

[57] ABSTRACT

In a circuit arrangement having a phototransistor, in order to increase the inverse voltage strength of the phototransistor, a resistor that carries off the collector-base inverse current generally lies between the base zone and the emitter zone of the phototransistor. This resistor should be as large as possible given illumination in order to increase the current gain. The resistor according to the invention is formed by the drain-source path of an IGFET of depletion type whose gate terminal is at a fixed potential. The IGFET is conductive in the unilluminated condition of the phototransistor. During illumination, its resistance increases given an increasing photocurrent.

9 Claims, 2 Drawing Figures

CIRCUIT ARRANGEMENT COMPRISING A PHOTOTRANSISTOR

BACKGROUND OF THE INVENTION

The present invention relates to a circuit arrangement comprising a phototransistor whose emitter-base path is bridged by a resistor.

Such a circuit arrangement has been described, for example, in the periodical "Siemens Components", 20 (1982), No. 3, pages 83-84, FIG. 2, incorporated herein by reference. The bridging of the base-emitter path of the phototransistor has the purpose of carrying off the collector-base inverse current that flows in the unilluminated condition of the phototransistor. An increase of the inverse voltage strength of the phototransistor by about a factor of 2 when compared to a phototransistor having an open base terminal is thus achieved. The resistor, however, is also effective in the illuminated condition of the phototransistor and deteriorates its current gain.

SUMMARY OF THE INVENTION

An object of the invention is to improve a circuit arrangement of the type initially described such that the resistor is the smallest in the unilluminated condition of the phototransistor and becomes less and less effective with increasing illumination of the phototransistor.

This goal is achieved in that the resistor is formed by the drain-source path of an IGFET of the depletion type and that the gate terminal of the IGFET is provided with a fixed potential.

DESCRIPTION OF THE PREFERRED EMBODIMENTS

Figure 1:
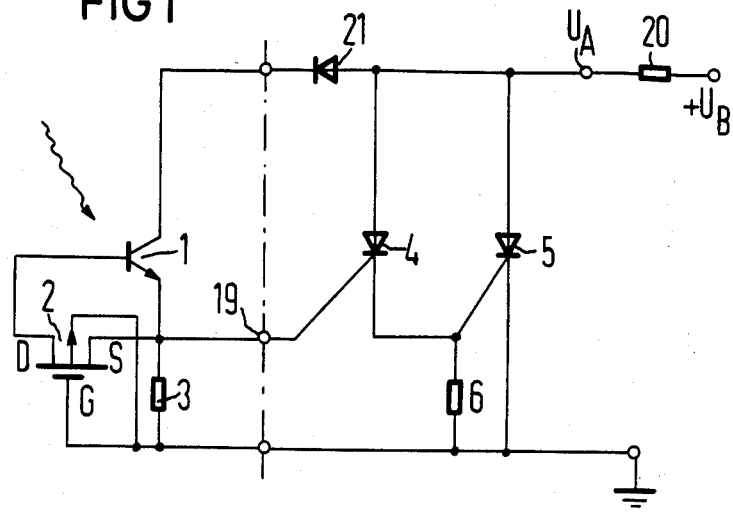
FIG. 1 illustrates a circuit of the invention for driving one or more thyristors.

The circuit arrangement according to FIG. 1 contains a phototransistor 1 whose collector is connected via a load resistor 20 to a terminal of a voltage source having the voltage $+U_B$. A diode 21 can be inserted into the lead-in for the protection of the phototransistor against voltage reversal. The emitter of the phototransistor 1 lies via a resistor 3 or a diode at the other terminal of the voltage source, for example at ground. The base terminal of the phototransistor is connected via the source-drain path of an IGFET 2 to the emitter terminal of the phototransistor. Either the source zone or the drain zone can thus be connected to the base terminal. Let it be the drain zone in the illustrative embodiment. The IGFET is of the depletion type. The gate terminal G of the IGFET 2 lies at fixed potential, for example at ground potential.

In the unilluminated condition, the full voltage $U_B$ is present at the phototransistor 1. Its collector-base inverse current thus flows through the source-drain path of the IGFET 2 to the emitter terminal of the phototransistor. In this condition, the potential at the emitter of the phototransistor 1 or at the source zone of the IGFET 2 is equal to or only slightly higher than the gate potential, that is in this case ground potential. The IGFET 2 is thus on and discharges the collector-base inverse current of the phototransistor 1.

Given a beginning light incidence, the emitter potential of the phototransistor and the source potential of the IGFET become higher and the channel resistance of the IGFET 2 increases, since the gate potential is retained. The IGFET 2 is preferably dimensioned such that it is inhibited at the nominal light power. Practically no base current thus flows and a maximum value of the current gain of the phototransistor 1 is achieved.

The current through the load 20 can be directly controlled with the phototransistor 1. For higher currents, it is preferable to employ the phototransistor for the drive of a thyristor or for the drive of a plurality of thyristors controlled in cascade. A thyristor 4 that is controlled by means of the emitter current of the phototransistor 1 is shown in the part to the right of the broken line in FIG. 1. This thyristor can be the main thyristor itself or an auxiliary thyristor for a following main thyristor 5. A resistor 6 lies between the gate terminal and the cathode terminal of the thyristor 5, said resistor 6 serving in known fashion to improve the dv/dt properties. At the same time, the emitter resistor 3 for the phototransistor 1 also has the effect of a dv/dt improvement for the auxiliary thyristor 4. Since a thyristor generally always has a cathode-base shunt, the separate resistor 3 can be eliminated when the phototransistor drives a thyristor. The resistor can even be completely eliminated under given conditions. The transistor current then flows through the gate-cathode path of the thyristor. In the unilluminated condition of the phototransistor, no emitter current flows and the thyristors 4, 5 remain inhibited. In the illuminated condition of the phototransistor, the emitter current thereof triggers the auxiliary thyristor 4 and the load current of the latter triggers the main thyristor 5.

Figure 2:
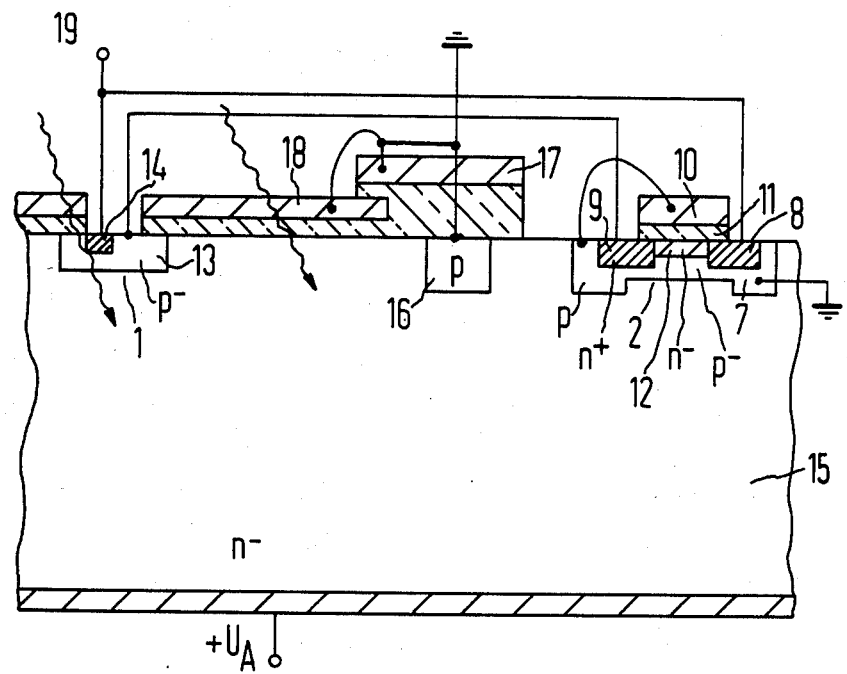
FIG. 2 illustrates a section through an integrated circuit which contains components of the arrangement according to FIG. 1 to the left of the broken line.

The phototransistor 1 and the depletion type IGFET 2 can be constructed in simple integrated form, as shown in FIG. 2. The basis for the integrated circuit is, for example, a weakly n-doped semiconductor body 15. This can have a resistivity between 30 and 50 Ohm-cm. A substrate zone 7 of the opposite conductivity type is embedded in the semiconductor body 15. The substrate zone 7 has more highly and weakly doped parts. A source zone 8 and a drain zone 9, again of the first conductivity type, are embedded in the substrate zone 7. A channel zone 12 of the same conductivity type as the source and drain zones, but more weakly doped, lies between source zone 8 and drain zone 9. The substrate zone 7 is likewise more weakly doped under the gate zone 12 than in its remaining region, this being indicated by the doping p−. An insulating layer 11, for example of silicon dioxide, lies above the gate zone. A gate electrode 10 which, for example, consists of doped polycrystalline silicon, lies on the insulating layer 11.

A doping of the source and drain zones of, for example $10^{20}$ cm$^{-3}$, a doping of the substrate with, for example, $10^{16}$ through $10^{17}$ cm$^{-3}$ for the p-doped part, and a doping with $10^{15}$ through $10^{16}$ cm$^{-3}$ for the p− doped part have proven practical for the stated purpose. The thickness of the gate oxide is for example, 70 nm, whereas the gate zone 12 is doped by means of ion implantation with a dosage of, for example, $1 \times 10^{12}$ cm$^{-2}$ arsenic atoms. The resistance of the depletion IGFET 2 then also depends on the length of the gate zone and on the width thereof. The length can, for example, lie between 5 and 100 μm and the width between 10 and 20 mm. The threshold voltage of the MOSFET is defined by the doping of the gate zone 12, the doping of the more weakly doped part of the substrate, and by the thickness of the gate oxide.

The base zone 13 of the phototransistor 1 is embedded in the same semiconductor body 15. It preferably has the same depth as the more weakly doped part of the substrate zone 7 and has the same doping concentration. The emitter zone 14 which is highly n-doped is embedded in the base zone 13. It is electrically connected to the source zone 8, whereas the base zone 13 is electrically connected to the drain zone 9. The substrate zone 7 is also electrically connected to the gate electrode 10.

The part of the semiconductor body 15 acting as the collector for the phototransistor 1 is convered with graduated or stepped field electrodes 17, 18 which rise upwardly in one step. These electrodes deform the space charge zone in the collector such that the largest possible part of the optically generated charge carriers flows to the base zone 13. This effect can be further intensified by means of an auxiliary zone 16 which lies between the base zone 13 and the substrate zone 7. This auxiliary zone is p-doped and lies at a fixed potential, preferably at ground potential. The auxiliary zone 16 preferably has the same depth and the same doping as the more strongly doped parts of the substrate zone 7. The substrate zone 7 can also lie at ground potential for discharging capacitive currents.

Although various minor changes and modifications might be proposed by those skilled in the art, it will be understood that we wish to include within the claims of the patent warranted hereon all such changes and modifications as reasonably come within our contribution to the art.

We claim as our invention:

1. A circuit arrangement, comprising:
    a phototransistor having a base, a collector, and an emitter, the collector connecting to a first potential, the emitter connecting to a second potential through means for providing a voltage drop, and a source-drain path of an IGFET of depletion type connected across the base and emitter of the phototransistor; and
    a gate terminal of said IGFET being connected to a potential having a value such that when the phototransistor is not illuminated, the IGFET is conducting, and as the phototransistor becomes illuminated, the voltage dropping means causing the IGFET to become non-conducting.

2. A circuit arrangement of claim 1 wherein said voltage dropping means comprises an emitter resistor connected in series with said phototransistor.

3. A circuit arrangement according to claim 1 wherein said IGFET comprises: a substrate zone of a first conductivity type embedded in a semiconductor body of a second conductivity type; a drain zone and source zone of said second conductivity type embedded in said substrate zone; a gate zone of second conductivity type doped lower than said source zone and said drain zone and lying between said source zone and said drain zone; said phototransistor being formed of a base zone of first conductivity type planarly embedded into said semiconductor body and an emitter zone of second conductivity type planarly embedded into said base zone; and said emitter zone being electrically connected to said source zone and said base zone being electrically connected to said drain zone.

4. A circuit arrangement, comprising:
    a phototransistor having a base, a collector, and an emitter, and a source-drain path of an IGFET of depletion type connected across the base and emitter of the phototransistor;
    a gate terminal of said IGFET being connected to a fixed potential;
    said IGFET comprising a substrate zone of a first conductivity type embedded in a semiconductor body of a second conductivity type, a drain zone and source zone of said second conductivity type embedded in said substrate zone, a gate zone of second conductivity type doped lower than said source zone and said drain zone and lying between said source zone and said drain zone, said phototransistor being formed of a base zone of first conductivity type planarly embedded into said semiconductor body, an emitter zone of second conductivity type planarly embedded into said base zone, and said emitter zone being electrically connected to said source zone and said base zone being electrically connected to said drain zone; and
    said substrate zone and gate terminal being at ground potential.

5. A circuit arrangement of claim 4 wherein said substrate zone comprises a higher and a lower doped region and wherein said lower doped region lies under the gate zone.

6. A circuit arrangement, comprising:
    first and second power supply terminals;
    a phototransistor whose collector is connected to the first terminal and whose emitter is connected through an emitter resistance to the second terminal;
    a base of the phototransistor connecting through a source-drain path of an IGFET of depletion type to a junction between the emitter and the emitter resistance of the phototransistor;
    a gate of the IGFET connecting to a fixed potential; and
    a load being driven from an output of said arrangement between said emitter and emitter resistance.

7. A circuit arrangement, comprising:
    first and second power supply terminals;
    a phototransistor whose collector is connected to the first terminal and whose emitter is connected through an emitter resistance to the second terminal;
    a base of the phototransistor connecting through a source-drain path of an IGFET of depletion type to a junction between the emitter and the emitter resistance of the phototransistor.

8. An integrated circuit arrangement, comprising:
    a first zone of first conductivity type having a terminal connected thereto, said terminal connecting to a first potential;
    second and third spaced apart zones of second conductivity type opposite to the first conductivity type embedded in the first zone;
    the second zone having an emitter zone of first conductivity type embedded therein;
    the third zone having source and drain zones of first conductivity type embedded therein with a channel therebetween and an insulator gate lying over the channel;
    the drain zone being connected to the second zone and the emitter zone being connected to the source zone and also to a second potential through a voltage dropping means;

said emitter zone, second zone, and first zone comprising a phototransistor; and the gate zone being connected to a potential having a value such that when the phototransistor is not illuminated, an FET formed by the source and drain zones and channel is conducting, and as the phototransistor becomes illuminated, the voltage dropping means causing the FET to become non-conducting.

9. An integrated circuit, comprising:

a first zone of first conductivity type having a terminal connected thereto;

second and third spaced apart zones of second conductivity type opposite to the first conductivity type embedded in the first zone;

the second zone having an emitter zone of first conductivity type embedded therein;

the third zone having source and drain zones of first conductivity type embedded therein with a channel there-between and an insulator gate lying over the channel;

the drain zone being connected to the second zone and the emitter zone being connected to the source zone;

said emitter zone, second zone, and first zone comprising a phototransistor;

the gate zone being connected to a fixed potential; and field electrode means being provided extending over portions of the phototransistor second zone and first zone to deform a space charge zone in the collector of the phototransistor so that a largest possible portion of optically generated charge carriers flows to the second zone functioning as a base zone.

* * * * *